United States Patent
Chung et al.

(10) Patent No.: US 6,743,694 B2
(45) Date of Patent: Jun. 1, 2004

(54) METHOD OF WAFER MARKING FOR MULTI-LAYER METAL PROCESSES

(75) Inventors: Ching Thiam Chung, Singapore (SG); Kay Jin Lee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 82 days.

(21) Appl. No.: 10/135,045

(22) Filed: Apr. 30, 2002

(65) Prior Publication Data

US 2003/0203589 A1 Oct. 30, 2003

(51) Int. Cl.⁷ .................... H01L 21/76; H01L 21/311
(52) U.S. Cl. ........................ 438/401; 438/694
(58) Field of Search ........................ 438/401

(56) References Cited

U.S. PATENT DOCUMENTS

| | | | |
|---|---|---|---|
| 5,610,104 A | 3/1997 | Mitchell | 437/228 |
| 5,877,064 A | 3/1999 | Chang et al. | 438/401 |
| 6,063,695 A | 5/2000 | Lin et al. | 438/462 |
| 6,156,676 A | 12/2000 | Sato et al. | 438/798 |
| 6,235,637 B1 | 5/2001 | Chen et al. | 438/694 |

*Primary Examiner*—Evan Pert
*Assistant Examiner*—Scott B. Geyer
(74) *Attorney, Agent, or Firm*—George O. Saile; Rosemary L. S. Pike

(57) ABSTRACT

A new method of forming a laser mark without damage to the wafer surface is described. A pad oxide layer is formed on a silicon wafer. A nitride layer is deposited overlying the pad oxide layer. A first trench is laser cut through the nitride layer and the pad oxide layer into the silicon wafer. The trench is etched to a second depth wherein the nitride layer is used as a hard mask and wherein the trench forms an identification mark.

25 Claims, 1 Drawing Sheet

METHOD OF WAFER MARKING FOR MULTI-LAYER METAL PROCESSES

BACKGROUND OF THE INVENTION (1) Field of the Invention

The invention relates to a method of wafer marking in the fabrication of integrated circuits, and more particularly, to a method of improved laser marking in the manufacture of integrated circuits.

(2) Description of the Prior Art

The fabrication of integrated circuits is accomplished by forming semiconductor devices on and within the surface of silicon wafers. Multiple chips or dice are formed on a wafer. In order to track the wafer and to identify the chips, laser identification marks are embedded into each wafer.

With the increasing number of metal layers and chemical mechanical polishing (CMP) processes, visibility and particle generation of the laser mark is becoming critically important. Typically, a laser beam is focused and pulsed in a pattern to create pits within the silicon to form these identification and tracking marks. The high energy pulses cause eruption of molten material from the wafer. The molten material is deposited adjacent to the laser marks forming ridges. These ridges formed in the conventional laser marking process cause micro-scratches to the surface of the wafer as they are dragged along the surface during the shallow trench isolation (STI) polishing process. These micro-scratches have been found to reduce yield. It is desired to find a process of laser marking that will enable good wafer identification marking visible on multi-layers without yield loss caused by micro-scratches.

U.S. Pat. No. 6,063,695 to Lin et al teaches cutting a laser mark, depositing a nonconformal layer, and then removing the ridges of material adjacent to the laser mark. The nonconformal layer protects the surface of the wafer during the removal process. U.S. Pat. No. 6,235,637 to Chen et al teaches forming a laser cut through a photoresist layer where the photoresist layer protects the wafer surface. U.S. Pat. No. 5,610,104 to Mitchell cuts a shallow laser mark, then oxidizes the substrate within the mark opening. The oxide is etched away to form the deep laser mark. U.S. Pat. No. 5,877,064 to Chang et al forms a laser mark on the non-patterned side of the wafer. U.S. Pat. No. 6,156,676 to Sato et al cuts a laser mark while flowing a gas to remove material so that the material is not deposited adjacent to the laser mark.

SUMMARY OF THE INVENTION

A principal object of the present invention is to provide an effective and very manufacturable method of forming a laser mark in the fabrication of integrated circuit devices.

Another object of the present invention is to provide an effective and very manufacturable method of forming a laser mark without damage to the wafer surface in the fabrication of integrated circuit devices.

In accordance with the objects of this invention a new method of forming a laser mark without damage to the wafer surface is achieved. A pad oxide layer is formed on a silicon wafer. A nitride layer is deposited overlying the pad oxide layer. A first trench is laser cut through the nitride layer and the pad oxide layer into the silicon wafer. The trench is etched to a second depth wherein the nitride layer is used as a hard mask and wherein the trench forms an identification mark.

BRIEF DESCRIPTION OF THE DRAWINGS

In the accompanying drawings forming a material part of this description, there is shown.

DESCRIPTION OF THE PREFERRED EMBODIMENTS

Figure 1:
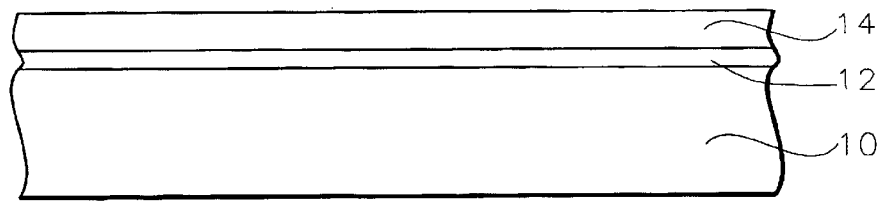
FIGS. 1 through 3 schematically illustrate in cross-sectional representation a preferred embodiment of the present invention.

The process of the present invention provides a method for forming a laser mark on a wafer while preventing damage to the wafer surface. Referring now more particularly to FIG. 1, there is illustrated a portion of a silicon wafer 10. A pad oxide layer 12 is formed on the surface of the wafer, for example to a thickness of between about 100 and 200 Angstroms. A silicon nitride layer 14 is deposited overlying the pad oxide layer 12 to a thickness of between about 2000 and 2500 Angstroms.

Figure 2:
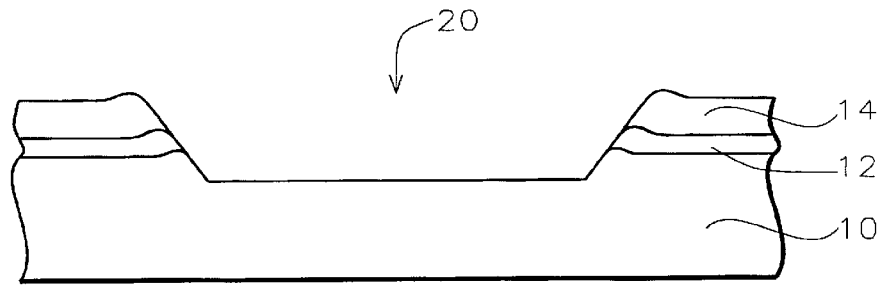

Now, a laser mark 20 is cut through the nitride and pad oxide layers and into the silicon wafer, as shown in FIG. 2. This is a super soft laser marking process wherein the laser melts and pushes aside the silicon without debris. A shallow laser mark 20 is formed having a depth of less than about 2 microns; between about 10,000 and 20,000 Angstroms.

Figure 3:
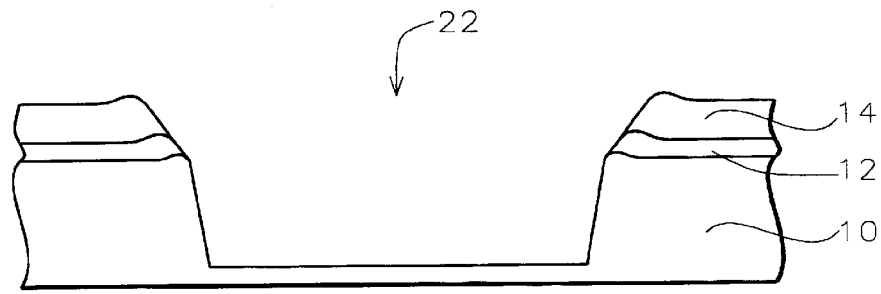

Referring now to FIG. 3, the mark 20 is made deeper by etching the silicon using a wet or dry etch method. The silicon is etched using the nitride layer 14 as a hard mask wherein the etch has a high selectivity to silicon with respect to nitride. The selectivity for silicon with respect to nitride should be between about 40 and 50 and preferably more than about 50. For example, this may be a wet etching using isopropyl alcohol (IPA) and potassium hydroxide (KOH) with temperature controlled to between about 25 and 50° C. The mark 22 is etched to a final depth of between about 50,000 and 60,000 Angstroms.

The process of the present invention provides a first shallow laser mark formed without debris. Then, the laser mark is made deeper by an etching process. Since no debris was formed during the laser cutting process, micro-scratches will not form during subsequent chemical mechanical polishing (CMP) processes. Thus, a laser mark of sufficient depth to enable good wafer identification marking visible on multiple layers is achieved without yield loss caused by micro-scratches.

While the invention has been particularly shown and described with reference to the preferred embodiments thereof, it will be understood by those skilled in the art that various changes in form and details may be made without departing from the spirit and scope of the invention.

What is claimed is:

1. A method of forming an identification mark on a silicon wafer comprising:

provide a hard mask layer on a silicon wafer;

laser cutting through said hard mask layer to said silicon wafer wherein a trench is formed in said silicon wafer having a first depth wherein said first depth is between about 15,000 and 20,000 Angstroms; and etching said trench to a second depth wherein said trench forms said identification mark.

2. The method according to claim 1 wherein said step of etching comprises etching said silicon wafer with a selectivity of silicon with respect to said hard mask of greater than about 50.

3. The method according to claim 1 wherein said step of etching is selected from the group consisting of wet etching and dry etching.

4. The method according to claim 1 wherein said step of etching comprises a wet etching with isopropyl alcohol and potassium hydroxide at a temperature of between about 25 and 50° C.

5. The method according to claim 1 wherein said second depth is between about 50,000 and 60,000 Angstroms.

6. The method according to claim 1 further comprising:
forming a pad oxide layer underlying said hard mask layer and having a thickness of between about 100 and 200 Angstroms.

7. The method according to claim 1 wherein said hard mask layer comprises silicon nitride having a thickness of between about 2000 and 2500 Angstroms.

8. The method according to claim 1 wherein said laser cutting forms a laser mark wherein no debris is formed at the sides of said laser mark.

9. A method of forming an identification mark on a silicon wafer comprising:
providing a hard mask layer on a silicon wafer;
laser cutting through said hard mask layer into said silicon wafer wherein a laser mark is formed in said silicon wafer having a first depth; and
etching said laser mark with a selectivity of silicon with respect to said hard mask of greater than about 50 to a second depth wherein said laser mark forms said identification mark.

10. The method according to claim 9 further comprising forming a pad oxide layer underlying said hard mask layer and having a thickness of between about 100 and 200 Angstroms.

11. The method according to claim 9 wherein said hard mask layer comprises silicon nitride having a thickness of between about 2000 and 2500 Angstroms.

12. The method according to claim 9 wherein during said laser cutting step no debris is formed at the sides of said laser mark.

13. The method according to claim 9 wherein said first depth is between about 15,000 and 20,000 Angstroms.

14. The method according to claim 9 wherein said step of etching is selected from the group consisting of wet etching and dry etching.

15. The method according to claim 9 wherein said step of etching comprises a wet etching with isopropyl alcohol and potassium hydroxide at a temperature of between about 25 and 50° C.

16. The method according to claim 9 wherein said second depth is between about 50,000 and 60,000 Angstroms.

17. A method of forming an identification mark on a silicon wafer comprising:
forming a pad oxide layer on a silicon wafer;
depositing a nitride layer overlying said pad oxide layer;
laser cutting through said nitride layer and said pad oxide layer into said silicon wafer wherein a trench is formed in said silicon wafer having a first depth; and
etching said trench to a second depth wherein said trench forms said identification mark.

18. The method according to claim 17 wherein said pad oxide layer has a thickness of between about 100 and 200 Angstroms.

19. The method according to claim 17 wherein said nitride layer comprises silicon nitride having a thickness of between about 2000 and 2500 Angstroms.

20. The method according to claim 17 wherein said laser cutting forms a laser mark wherein no debris is formed at the sides of said laser mark.

21. The method according to claim 17 wherein said first depth is between about 15,000 and 20,000 Angstroms.

22. The method according to claim 17 wherein said step of etching is selected from the group consisting of wet etching and dry etching.

23. The method according to claim 17 wherein said step of etching comprises etching said silicon wafer with a selectivity of silicon with respect to nitride of greater than about 50.

24. The method according to claim 17 wherein said step of etching comprises a wet etching with isopropyl alcohol and potassium hydroxide at a temperature of between about 25 and 50° C.

25. The method according to claim 17 wherein said second depth is between about 50,000 and 60,000 Angstroms.

* * * * *